United States Patent [19]

Hilker

[11] 4,290,137
[45] Sep. 15, 1981

[54] APPARATUS AND METHOD OF TESTING CML CIRCUITS

[75] Inventor: Dennis C. Hilker, Cave Creek, Ariz.

[73] Assignee: Honeywell Information Systems Inc., Phoenix, Ariz.

[21] Appl. No.: 106,573

[22] Filed: Dec. 26, 1979

[51] Int. Cl.³ .................................. G01R 15/12
[52] U.S. Cl. ........................ 371/24; 324/73 AT
[58] Field of Search .......... 371/24; 324/73 R, 73 AT, 324/73 PC

[56] References Cited

U.S. PATENT DOCUMENTS

| | | | |
|---|---|---|---|
| 3,597,682 | 8/1971 | Hubbs | 324/73 AT |
| 3,621,387 | 11/1971 | Smith | 324/73 R |
| 3,633,016 | 1/1972 | Walker et al. | 371/24 |
| 3,832,535 | 8/1974 | Vito | 324/73 AT X |
| 3,922,537 | 11/1975 | Jackson | 324/73 R X |
| 4,092,589 | 5/1978 | Chau et al. | 324/73 R |

OTHER PUBLICATIONS

Shattuck "Logic Card Test Apparatus" *IBM Tech. Disclosure Bulletin* vol. 13 No. 3 Aug. 1970 p. 605.

Primary Examiner—David H. Malzahn
Attorney, Agent, or Firm—William W. Holloway, Jr.; L. J. Marhoefer; N. Prasinos

[57] ABSTRACT

A testing apparatus for CML integrated circuits having a power splitter connected at its input to a pulse generator, and at one output to a test unit and at its other output to the CML circuit through a matrix. The output waveform of the CML circuit is provided through the matrix to the test unit.

11 Claims, 5 Drawing Figures

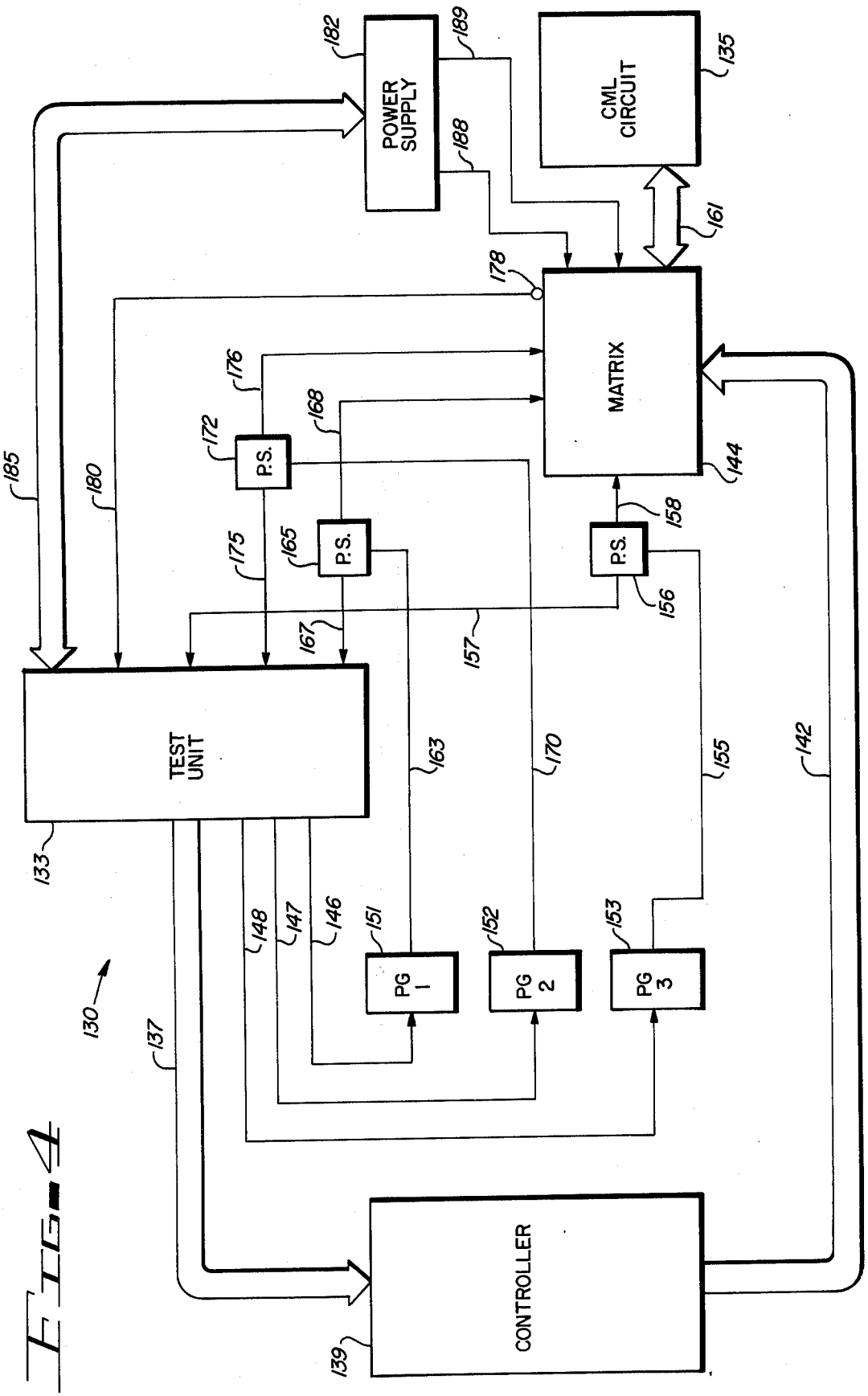

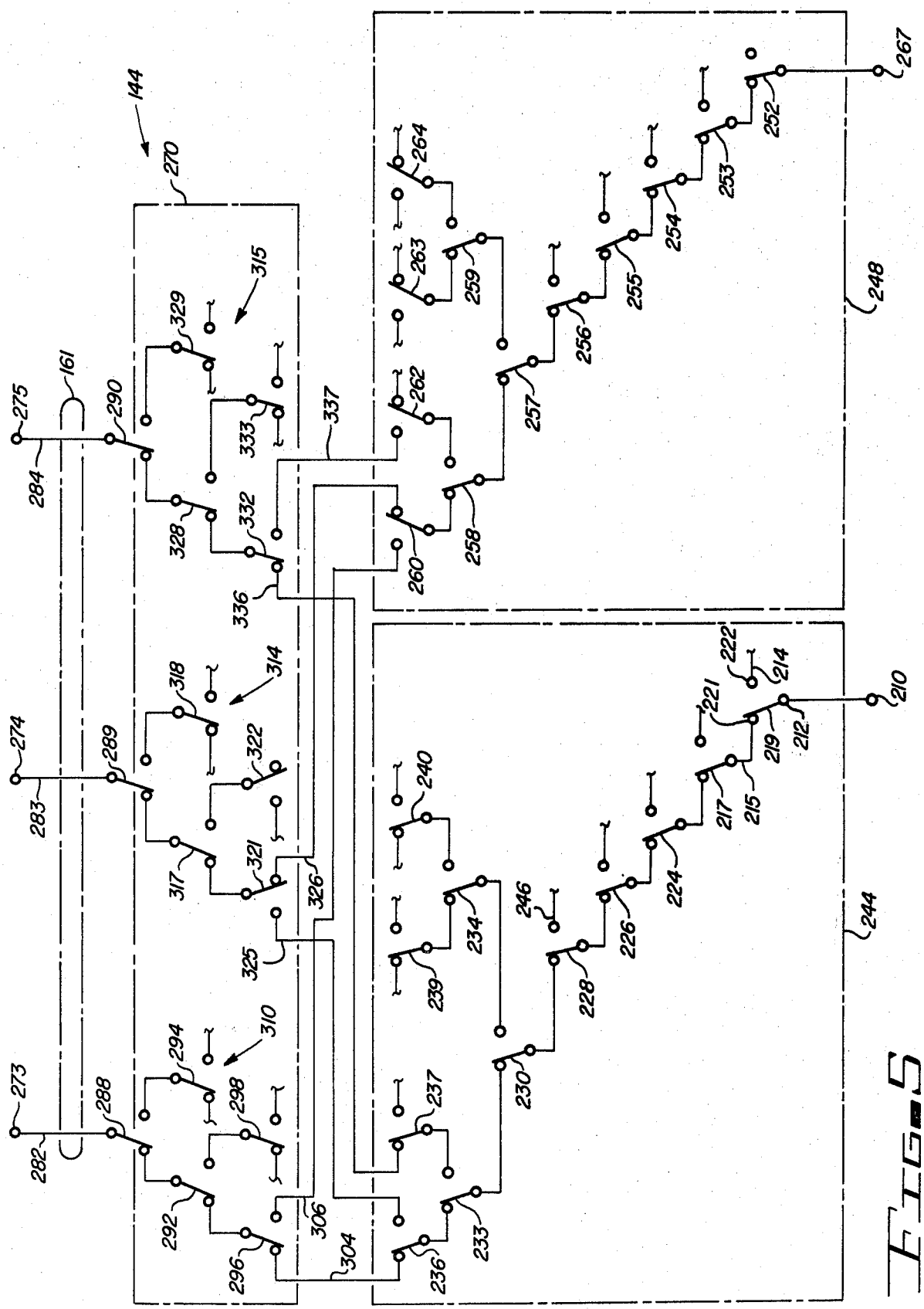

APPARATUS AND METHOD OF TESTING CML CIRCUITS

BACKGROUND OF THE INVENTION

1. Field of the Invention

This invention relates to the testing of CML apparatus and methods, and, more particularly, to a testing apparatus and method which utilizes a power splitter.

2. Description of the Prior Art

It is desirable to fully characterize the propagation delays and transition times of integrated current mode logic (CML) integrated circuits. For relatively small scale integrated circuits a direct probing method was utilized. Specific input and output pins of the CML circuit were connected through printed circuit boards to an oscilloscope and pulse generator. This apparatus and method for characterizing the circuits was effective but as the complexity and higher pin density of large scale integrated circuits the need for another method of characterizing the devices became apparent.

The basic CML circuit has a constant current source applied to the emitters of two transistors. The base of one transistor is connected to a reference voltage and the base of the other transistor is connected to the input signal which is designed to actuate the switching circuit. The collectors of both transistors are tied through resistors to ground. The output of the basic CML switching circuit can be considered to be at either of the collectors of the two transistors. The voltage present on the output of the collector having the reference voltage applied thereto is considered to be the true output and the collector voltage of the other transistor is considered to be the complement. This basic circuit can be utilized to construct the various digital circuits known in the art. For example, it can be utilized to construct AND gates, OR gates, registers, etc.

In order to properly design digital systems it is necessary that the propagation delays and the transition times along with other characteristics of the integrated circuit be known to the designer. Therefore, testing of the CML integrated circuits is necessary. As set forth above the original technique utilized was to directly probe the integrated circuit. With the advent of large scale integrated circuits this became impractical due to the number of pins on the integrated circuit and the number of basic switching circuits present on the CML integrated circuit. The prior constructions of CML testing apparatus do not show the utilization of a power splitter and relay matrix.

SUMMARY OF THE INVENTION

A test apparatus for CML integrated circuits is shown herein. The apparatus has a test unit which is capable of determining differences in the pulses and various waveforms that it receives. The differences analyzed by the test unit include time delays. That is the differences in the arrival of the input pulse or waveform and the occurrence of the output pulse or waveform from the CML circuit. As utilized herein the inputs to the CML circuit under test will be referred to as pulses and the output referred to as a waveform. The test unit is capable of actuating two pulse generators. Each pulse generator is capable of producing a pulse of a predetermined shape. The shaped pulses are applied to their respective power splitters. Each power splitter is capable of providing the shaped pulse applied thereto at two of its outputs. One output of the power splitters is connected to the test unit, and the other output is connected through a matrix of relays to an appropriate fixture having the CML integrated circuit under test attached thereto. The relays are electrically actuated and each relay has a connector movable between two electrical contacts. A controller unit provides the necessary switching signals to control the switching of the relays. The relays are interconnected to form a number of submatrices and a pin connection matrix. The pin connection matrix is adapted to connect many of the submatrices to a particular pin of the CML circuit. Each pin of the CML integrated circuit is connected to the pin connection matrix through the fixture. Two of the submatrices obtain their inputs from the other output of the power splitters. Another submatrix is connected to a noncritical pulse generator which is also actuated by the test unit. Another of the submatrices is utilized to transfer the output waveform to a waveform output of the matrix. This output is connected through a probe Tee to the test unit. The controller which provides the switching signals to the relays is ultimately under the control of the test unit.

The test unit is also connected to programmable power supplies which are capable of supplying variable voltage (power) at its outputs in response to the inputs from the test unit. The voltage from the power supply is connected through two submatrices to selected pins of the CML circuit. These pins would of course be the appropriate pins for supplying power to the CML circuit. The power supply is capable of varying the voltage applied (or supplied) to the CML circuit to provide a number of operating environments. The response of the circuit to the changes in the power supplied thereto can be utilized to further characterize the circuit.

The method of testing the CML circuit is to apply the shaped pulses to pins of the circuit. The shaped pulses are also utilized as inputs to the test unit. The other input to the test unit for comparison purposes and characterizing the CML circuit under test is transferred through the matrix and comprises the output waveform from a pin of the CML circuit under test. The shaped pulses are compared with the output waveform including the delay between the receipt of the shaped pulses and the occurrence output waveform to determine the characteristics of the device. The voltage (power) supplied to selected pins of the CML circuit is varied and this is utilized to compare what effect variations in the power supply have on the output waveform including any change in the delay between the application of the shaped pulses to the CML circuit and the generation of the output waveform. The process is continued until all possible combinations of pins and the desired variations of the voltage supplied to the CML circuit are exhausted as necessary to fully characterize the CML circuit.

It is an advantage of the present invention to provide a shaped pulse through a power splitter to the test unit and to the CML circuit under test.

It is a further advantage of the present invention to provide the shaped pulse through a matrix which is capable of connecting the shaped pulse to any pin of the CML circuit.

It is a further advantage of the present invention to provide the output waveform of any of the pins of the CML circuit to the test unit through a matrix.

Another advantage of the present invention is to connect selected pins of the CML circuit under test to a variable power supply which is controlled by the test unit.

BRIEF DESCRIPTION OF THE DRAWINGS

FIG. 4 is a block diagram of an embodiment of the present invention; and

FIG. 5 is a schematic drawing of a portion of the relay matrix shown in FIG. 4.

DESCRIPTION OF THE PREFERRED EMBODIMENT

Figure 1:
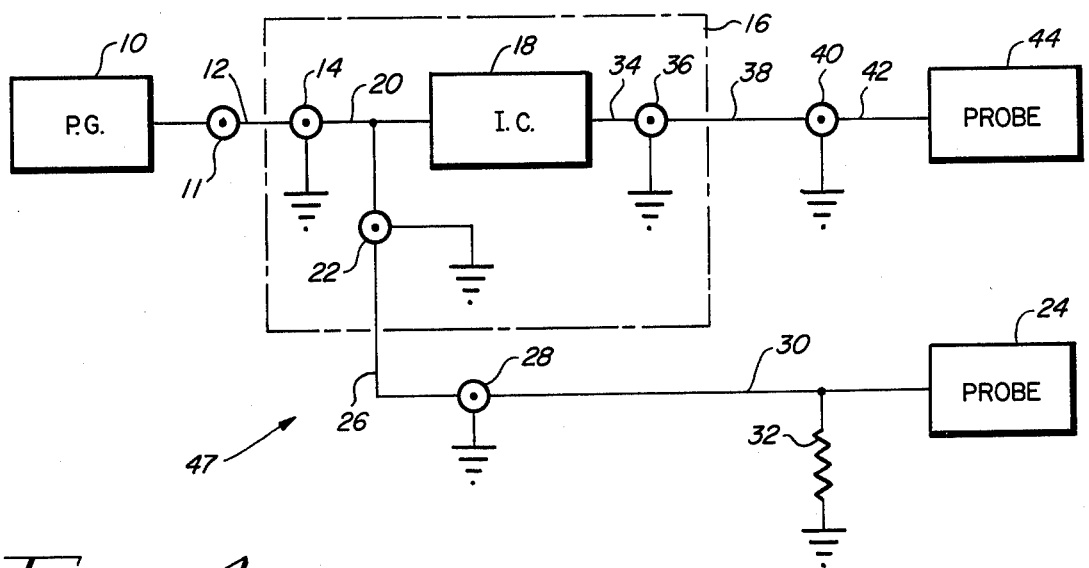
FIG. 1 is a block diagram of simplified circuitry for testing CML circuits.

As shown in FIG. 1, a pulse generator 10 is connected through a connector 11, a line 12 and a connector 14 on a fixture 16 to a CML integrated circuit 18. Connector 14 is connected through strip line 20 to CML circuit 18 and to connector 22. Connector 22 is also connected to probe 24 through line 26, connector 28 and line 30. Line 30 is also connected to ground through resistor 32. Typically resistor 32 has a magnitude of 50 ohms.

Figure 2:
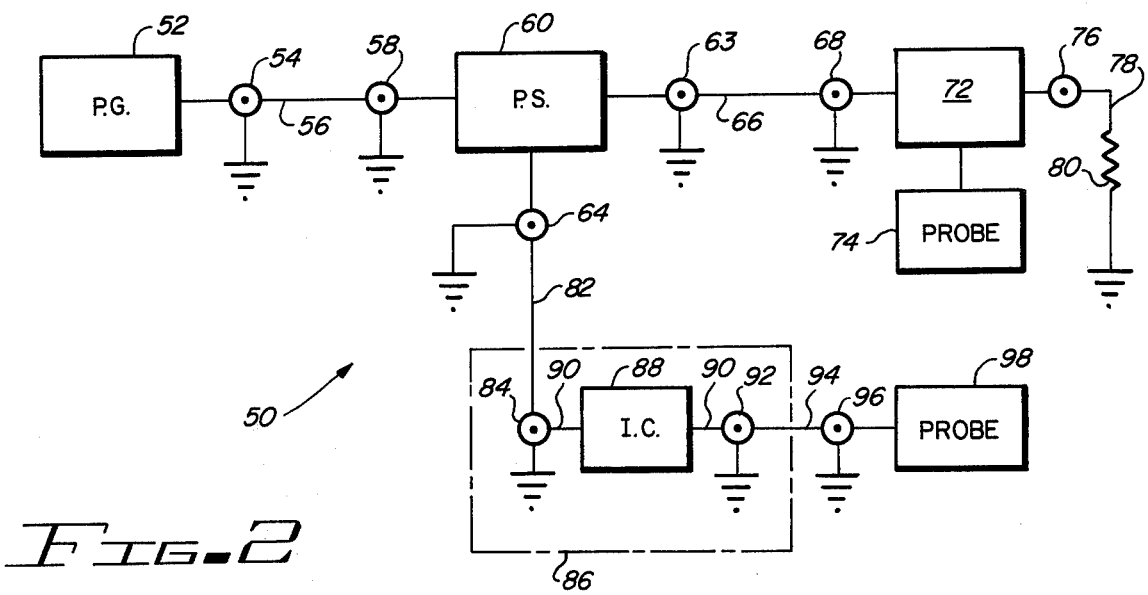
FIG. 2 is a simplified circuitry for testing CML circuits constructed according to the present invention.

One pin of CML circuit 18 is connected through strip line 34, connector 36, line 38, connector 40, and line 42 to a probe 44. Probes 24 and 44 are connected to the test unit (not shown in FIG. 1) for determining the responses of CML circuit 18 for the purpose of analyzing the characteristics thereof. The shape pulse generated by pulse generator 10 is applied to circuit 18 and probe 24. The output waveform of the CML circuit 18 under test is applied to probe 44 through strip line 34. Resistor 32 is utilized to terminate the input to probe 24. Connectors 22 and 36 are located on fixture 16. The circuitry 47 of FIG. 1 provides one arrangement for measuring the characteristics of a CML circuit. Another arrangement which is utilized with the present invention is shown in FIG. 2.

The circuitry 50 has a pulse generator 52 which is capable of forming a pulse of known shape, magnitude, and duration. Pulse generator 52 is connected through connector 54, line 56, and connector 58 to a power splitter 60. Power splitter 60 provides the shaped pulse received at its input from connector 58 at two outputs to connectors 63 and 64. The shaped pulse from power splitter 60 is connected through connector 63, line 66, and connector 68 to a probe Tee 72. The probe Tee 72 provides the shaped pulse to probe 74 and through connector 76 and line 78 to a resistor 80. The other opposite end of resistor 80 away from line 78 is connected to ground. Resistor 80 is utilized to terminate the output of power splitter 60 to connector 63. Resistor 80 is in testing CML circuits typically 50 ohms in magnitude. Connectors 68 and 76 are actually integral parts of the probe Tee 72.

The other output of power splitter 60 from connector 64 is connected through line 82 to a connector 84 on fixture 86. Fixture 86 provides the necessary physical setting for the CML integrated circuit 88. The shaped pulse from power splitter 60 is connected through connector 84 and strip line 90 to CML circuit 88. The output waveform of CML circuit 88 is connected through strip line 90 to a connector 92 on fixture 86. Connector 92 provides the output waveform on strip line 90 through line 94 and connector 96 to probe 98. All the lines such as line 94 of FIGS. 1 and 2 are preferably of the shielded type.

The shaped pulse produced by pulse generator 52 provided to line 56 is utilized by a test unit (not shown in FIG. 2) through probe 74. The output waveform of circuit 88 is provided to probe 98 of the test unit. The shaped pulse and the waveform from probes 74 and 98, respectively, are utilized by the test unit to determine the characteristics of CML circuit 88. Thus circuitry 50 provides a means to determine the time delay between the arrival of the input incident wave (the shaped pulse) and the output waveform. This, of course, includes the delay attributable to input loading. The circuitry 47 of FIG. 1 does not include the delay due to input loading. It has been found to be desirable in many applications to include the input loading delay in the characteristics of the device under test.

Figure 3:
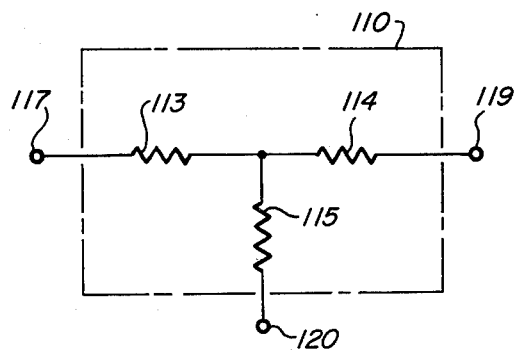
FIG. 3 is an example of the power splitter shown in FIG. 2.

As shown in FIG. 3, a type of power splitter 110 is shown. Power splitter 110 can be utilized as the power splitter 60 in FIG. 2. Power splitter 110 is provided with three resistors 113 through 115 which are arranged in a "Y" network. In other words the three resistors are connected at one end to a common terminal and have their other ends connected to the input terminal 117 and the output terminals 119 and 120 of power splitter 110. The value of the resistors can be, for example, 16.7 ohms.

FIG. 4 shows a block diagram forming a complete CML testing apparatus 130. The apparatus 130 includes a test unit 133 which is both capable of directing the various components of the system as required and of determining the characteristics of the CML circuit 135. These characteristics include the delay between the application of a shaped pulse to the CML circuit and its response of producing an output waveform. The test unit is connected through multiline channel 137 to a controller 139. Through channel 137 test unit 133 provides controller 139 with the necessary signals to ensure that controller 139 provides the proper switching signals through multiline channel 142 to matrix 144. Matrix 144 is comprised of a number of relays and will be discussed in detail in connection with FIG. 5. Controller 139 is connected to each relay within matrix 144 through channel 142 and provides a switching signal to each relay. Each relay responds to its switching signal by moving a connector from one contact to another.

Test unit 133 is connected through lines 146 through 148 to pulse generators 151 through 153, respectively. Pulse generators 151 and 152 provide a shaped pulse when actuated by test unit 133 through lines 146 and 147, respectively, of a known shape, duration, and magnitude. Pulse generator 153 is also actuated by test unit 133, through line 148. The pulse provided by pulse generator 153 is of a generally known shape and magnitude but its pulse is noncritical to the function of apparatus 130. If such a pulse is not required for characterizing certain CML circuits it can be eliminated. Pulse generator 153 is connected through line 155 to the input of a power splitter 156. The outputs of power splitter 156 are connected through lines 157 and 158 to test unit 133 and matrix 144, respectively. Matrix 144 is adapted to apply the pulse on line 158 to any pin of the CML circuit 135 through mutiline channel 161.

Channel 161 includes the strip lines on the fixture (not shown) as described in in connection with FIG. 2 and connects to each pin of the CML circuit 135. The pulse generated by pulse generator 151 is connected through line 163 to the input of power splitter 165. The outputs of power splitter 165 are connected through lines 167 and 168 to test unit 133 and matrix 144, respectively. Matrix 144 is capable of applying the shaped pulse from pulse generator 151 which is supplied through power splitter 165 to any of the pins of CML circuit 135.

The output of pulse generator 152, which as discussed above is a shaped pulse, is connected through line 170 to the input of power splitter 172. The outputs of power splitter 172 are connected through lines 175 and 176 to test unit 133 and matrix 144, respectively. Matrix 144 is capable of connecting the output of power splitter 172, which is the pulse from pulse generator 152, to any pin of CML circuit 135 under the control of controller 139. One pin of CML circuit 135 is selected as the output waveform by matrix 144 and provided at a waveform output 178 of the matrix 144. The output waveform from CML circuit 135 is provided through the waveform output 178 of matrix 144 through line 180 to an input of test unit 133.

Test unit 133 provides commands to power supply 182 through multiline channel 185. Test unit 133 also receives various control signals and status signals concerning power supply 182 through channel 185. Power supply 182 responds to the commands from test unit 133 by varying the voltage it supplies to lines 188 and 189. Various voltage configurations can be applied to CML circuits. For example, power supply 182 could supply approximately $-3.3$ volts to line 188 and $-0.26$ volts D.C. to line 189. Various other voltages that might be necessary to fully test the CML circuit 135 can be supplied by the power supply 182. Each of the different various voltages would require an additional line to matrix 144 and the matrix would have to be expanded as required. Lines 188 and 189 are connected through matrix 144 under the command of controller 139 to selected inputs, i.e., the power supply inputs, of CML circuit 135.

A detailed schematic of a portion of matrix 144 is shown in FIG. 5. Although only a portion of matrix 144 is shown those skilled in the art can readily expand the matrix to its full capability. The matrix 144 provides minimum electronic discontinuity for testing waveform distortion because the matrix has no transmission line stubs. In addition the particular matrix shown in FIG. 5 is exemplary only and other matrices as known in the art can be utilized with the present invention. Terminal 210 can be, for example, connected to line 168 from power splitter 165 (FIG. 4). Terminal 210 is connected to a relay 212. The output of relay 212 is connected to lines 214 and 215. Line 215 as shown in FIG. 5 is connected to relay 217. Relay 212 is comprised of a connector 219, which is connected to terminal 210, and contacts 221 and 222. Connector 219 is movable between contacts 221 and 222 when actuated by a switching signal from controller 139 through channel 142. One of the lines comprising channel 142 is connected to each of the relays shown in FIG. 4 including relay 212. All of the relays shown in FIG. 5 are similar in operation and the detailed discussion of relay 212 above shall suffice for all.

Line 214 is connected to another relay (not shown) which is on the same level as relay 217. The portion of the matrix connected to line 214 and its relays is expanded much the same as the portion of the matrix shown in FIG. 5. Relay 217 is connected to relay 224 and another relay (not shown). Relay 224 is in turn connected to another relay (not shown) and relay 226. Relay 226 is connected to relay 228 and another relay (not shown). Relay 228 is connected to a relay (not shown) and to relay 230. Relay 230 is connected to relays 233 and 234. Relay 233 is connected to relays 236 and 237, and relay 234 is connected to relays 239 and 240. Relays 212, 217, 224, 226, 228, 230, 233, 234, 236, 237, 239 and 240 comprise along with the other relays not shown a submatrix 244.

In an example of expansion, relay 228 would be connected through line 246 to a relay corresponding to relay 230 which in turn is connected to relays corresponding to relays 233 and 234. In addition, those relays would be connected to four relays which correspond to relays 236, 237, 239 and 240. All of the relays, for example, relays 236, 237, 239 and 240 are located within a certain level of the matrix. For example, the first level of submatrix 244 comprises only relay 212. The second level contains relay 217 and another relay (not shown). The third level would have four relays (only one relay 224 is shown). Other additional levels than those shown can be provided as desired. Another submatrix 248 is shown in FIG. 5. As many submatrices as are desired can be provided.

Submatrix 248, which can be identical to submatrix 244 with the other submatrices being substantially identical therewith, comprises as shown relays 252 through 264 which correspond to relays 212, 217, 224, 226, 228, 230, 233, 234, 236, 237, 239 and 240 respectively, of submatrix 244. Other relays (not shown) in submatrix 248 would be provided corresponding to those relays (not shown) in submatrix 244.

Terminal 267 which is connected to relay 252 can be connected, for example, to waveform output 178 (FIG. 4). Terminal 267 can also be connected alternatively to lines 188, 189, 176 or 158. It should be noted that all of the relays of a level within a particular submatrix are switched simutaneously.

A pin connection matrix 270 is also shown in FIG. 5. The pin connection matrix is capable of switching any of the submatrices to any desired pin of the CML circuit. Only three pins 273 through 275 of CML circuit 135 are shown in FIG. 5. Pins 273 through 275 are connected to lines 282 through 284, respectively. Lines 282 through 284 are included within channel 161 and include the appropriate strip line of a fixture (not shown). Lines 282 through 284 are connected to relays 288 through 290. Relay 288 is connected to relays 292 and 294. Relay 292 is connected in turn to relays 296 and 298. Relay 296 is connected through lines 304 and 306 to relays 236 and 260, respectively. Relays 236 and 260 are as discussed above a portion of submatrices 244 and 248, respectively. Relay 298 would also be connected to submatrices (not shown). Relay 294 can be connected to other relays similar to relays 296 and 298 or to other submatrices as required. Relays 288, 292, 294, 296 and 298 comprise a nodule 310. The other nodules 314 and 315 shown in FIG. 5 are similar to nodule 310 and the detailed discussion of nodule 310 above shall suffice for all. A nodule similar to nodules 310, 314 and 315 is included within pin connection matrix 270 for each of the pins of CML circuit 135. As with the levels of the submatrices, each of the relays on a particular level of each nodule are switched simultaneously.

Relay 289 of nodule 314 is connected to relays 317 and 318. Relay 317 is connected in turn to relays 321 and 322. Relay 321 is connected through lines 325 and 326 to relays 236 and 260, respectively. Relays 289, 317, 318, 321, and 322 comprise nodule 314.

Relay 290 of nodule 215 is connected to relays 328 and 329. Relay 228 is connected in turn to relays 332 and 333. Relay 332 is connected through lines 336 and 337 to relays 237 and 262, respectively. The relays on the same level of each nodule, for example, relays 296 and 298 are actuated simultaneously. Relays 290, 328, 329, 332 and 333 comprise nodule 315.

As shown in FIG. 5, terminal 210 is connected to pin 273 through the relays of submatrix 224 and nodule 310, and terminal 267 is connected to pin 274 through the relays of submatrix 248 and nodule 314. If terminal 267 is connected to the waveform output 178 (FIG. 4) the output waveform being examined would be present on pin 274.

In operation, the test unit 33 (FIG. 4) directs controller 139 through multiline channel 137 to select a certain configuration of the matrix 144, for example, terminal 210 connected to pin 273 and terminal 267 to pin 274. The other submatrices would also be connected to other pins of the CML circuit 135. Pulse generators 151, 152 and 153 are actuated in any desired sequence by the test unit 133. The output of the pulse generators is divided by the power splitters 156, 165, and 172 and is utilized as inputs to matrix 144. The connection of one pulse generator through matrix 144 would be that shown in FIG. 2. The test unit also directs certain power configurations to be applied to the CML circuit 135 through lines 188 and 189 as connected by matrix 144. Thus, the pulses present on lines 158, 168 and 176 are applied as desired through matrix 144 to the CML circuit 135. The desired power which is varied during the test cycle as desired is applied through lines 188 and 189, and matrix 144 to selected pins of CML circuit 135. The output waveform is directed from a particular pin through matrix 144 and waveform output 178 to test unit 133. Test unit 133 receives the output waveform through line 180 and compares it with the pulses generated by the pulse generators from the power splitters through lines 157, 167 and 175. The test unit determines the characteristics of the device including any time delays involved from the received pulses and the output waveform. The various appropriate combinations of pulses applied to various pins must be exhausted to fully characterize the CML circuit.

Whereas the present invention has been described in particular relation to the drawings attached hereto it should be understood that other and further modifications, apart from those shown or suggested herein, may be made within the spirit and scope of this invention.

What is claimed is:

1. Test apparatus for CML integrated circuit comprising:
   a. a first pulse generator capable of producing a first shaped pulse when actuated;
   b. a second pulse generator capable of producing a second shaped pulse when actuated;
   c. a first power splitter connected to receive said first shaped pulse and providing said first shaped pulse at two outputs thereof;
   d. a second power splitter connected to receive said second shaped pulse and providing said second shaped pulse at two outputs thereof;
   e. a plurality of electrically actuated relays, each relay movable between a first and second position from one electrical contact to another electrical contact in response to a switching signal, said plurality of relays being connected to said circuit, one output of said first power splitter, and one output of said second power splitter; said relays arranged in a matrix to connect said first and second shaped pulse to any pin of said circuit and provide an output waveform from any pin of said circuit at a waveform output thereof;
   f. a controller connected to said relays for providing said switching signal to each relay as required; and
   g. a test unit connected to other outputs of said first and second power splitters opposite to said one output thereof, and to said waveform output for measuring differences including time delays between said first and second shaped pulse and said waveform, said test unit providing control signals to said controller and actuating said first and second pulse generators.

2. Test apparatus as set forth in claim 1 including a third pulse generator producing a third pulse, and a third power splitter having an input connected to said third pulse generator for receiving said third pulse and one output connected to said test unit and another output connected to said circuit through said matrix.

3. Test apparatus as set forth in claim 1 wherein a first and second probe Tee are connected between said test unit, and said first and second power splitters, respectively.

4. Test apparatus as set forth in claim 3 including a power supply capable of providing a plurality of voltage configurations at outputs thereof in response to said test unit, said matrix connected to said outputs of said power supply for providing said voltage configurations to selected pins of said circuit in response to switching signals provided to said matrix by said controller.

5. A method of testing a CML integrated circuit comprising the steps of:
   a. applying a first pulse from a first power splitter to a test unit and selectively through a matrix of relays to a first pin of said circuit;
   b. applying a second shaped pulse from a second power splitter to said test unit and selectively through said matrix of relays to a second pin of said circuit;
   c. transferring an output waveform of a third pin of said circuit to a waveform output of said matrix;
   d. varying voltage supplied through said matrix to selected pins of said circuit;
   e. comparing said first shaped pulse and said second shaped pulse to said output waveform within said test unit; and
   f. repeating steps a, b, c, and d for all posible combinations of pins.

6. A test apparatus for a CML integrated circuit comprising:
   a. a first pulse generator capable of producing a first shaped pulse when actuated;
   b. a second pulse generator capable of producing a second shaped pulse when actuated;
   c. a first power splitter connected to receive said first shaped pulse and providing said first shaped pulse at two outputs thereof;
   d. a second power splitter connected to receive said second shaped pulse and providing said second shaped pulse at two outputs thereof;
   e. a plurality of electrically actuated relays, each relay movable between a first and second position from one electrical contact to another electrical contact in response to a switching signal, said relays being connected to one output of said first power splitter, to one output of said second power splitter, and to said circuit, said relays arranged in a matrix to connect said first shaped pulse and said second shaped pulse to any pin of said circuit and providing the output waveform from any pin of said circuit at a waveform output thereof;
f. a controller connected to said relays for providing said switching signal to each relay as required;
g. a test unit connected to another output of said first power splitter opposite to said one output thereof, to another output of said second power splitter opposite to said one output thereof, and to said waveform output for measuring differences including time delays between said first and second shaped pulses and said waveform, said test unit connected to said controller for providing control signals thereto and connected to said first and second pulse generators for actuation thereof; and
h. a variable power supply connected to selected pins of said circuit through said matrix of relays and connected to said test unit for responding thereto to provide a plurality of voltage configurations to said circuit.

7. Testing apparatus for CML integrated circuits having a plurality of pins, comprising:
a. a first pulse generator capable of producing a first shaped pulse when actuated;
b. a second pulse generator capable of producing a second shaped pulse when actuated;
c. a first power splitter connected to receive said first shaped pulse and providing said first shaped pulse at two outputs thereof;
d. a second power splitter connected to receive said second shaped pulse and providing said second shaped pulse at two outputs thereof;
e. a plurality of electrically actuated relays forming a matrix, each relay movable between a first and second position in response to a switching signal, said matrix being divided into a plurality of submatrices and a pin connection matrix, said pin connection matrix connected to said submatrices and capable of selectively connecting each submatrix of said plurality of submatrices to any pin of said circuit, a first submatrix connected to one output of said first power splitter and to said pin connection matrix for providing said first shaped pulse selectively to one pin of said circuit, a second submatrix connected to one output of said second power splitter and to said pin connection matrix for providing said second shaped pulse selectively to another pin of said circuit; a third submatrix connected to said pin connection matrix for receiving an output waveform from a certain pin of said circuit and transferring said output waveform to a waveform output thereof;
f. a controller connected to said relays for providing said switching signal to each relay as required; and
g. a test unit connected to other outputs of said first and second power splitters opposite to said one output thereof and to said waveform output for measuring differences including time delays between said first and second shaped pulses and said output waveform, said test unit connected to said controller and said first and said second pulse generators for providing control signals to said controller and actuating said first and second pulse generators.

8. Testing apparatus as set forth in claim 7 including a variable power supply, and a fourth and fifth submatrices connected between said variable power supply and said pin connection matrix for supplying variable voltage to selected pins of said circuits.

9. A testing apparatus determining the characteristics of a CML integrated circuit, which has a plurality of pins, comprising:
a. a first pulse means generating a first shaped pulse upon actuation;
b. a second pulse means generating a second shaped pulse upon actuation;
c. a first power splitter means connected to receive said first shaped pulse for transferring said first shaped pulse to outputs thereof;
d. a second power splitter means connected to receive said second shaped pulse for transferring said second shaped pulse to the outputs thereof;
e. a matrix means connected to one output of said first and said second power splitter means and to said pins of said circuit, said matrix means adapted to selectively connect said first and second shaped pulses from said one output of said first and said one output of second power splitter means, respectively, to said pins of said circuit and to transfer an output waveform present on a pin of said circuit to a waveform output thereof; and
f. a test means connected to other outputs of said first and second power splitter means and to said waveform output for determining differences between said first and second shaped pulses and said output waveform including time delays.

10. Testing apparatus as set forth in claim 9 including a variable power means supplying certain voltages and connected to said matrix, said matrix applying said certain voltage to selected pins of said circuit.

11. Testing apparatus as set forth in claim 10 wherein said test means is connected to said power means for determining the level of said certain voltages connected to said matrix means.

* * * * *